United States Patent
Vittimani et al.

(10) Patent No.: US 12,210,880 B2
(45) Date of Patent: Jan. 28, 2025

(54) DEVICE WITH CLIENT CONFIGURATION AND RELATED METHOD

(71) Applicant: STMICROELECTRONICS S.r.l., Agrate Brianza (IT)

(72) Inventors: Roberta Vittimani, Agrate Brianza (IT); Martina Trogu, Vimercate (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 98 days.

(21) Appl. No.: 17/587,887

(22) Filed: Jan. 28, 2022

(65) Prior Publication Data
US 2023/0290393 A1 Sep. 14, 2023

(51) Int. Cl.
| | |
|---|---|
| *G06F 9/4401* | (2018.01) |
| *G11C 7/10* | (2006.01) |
| *G11C 7/20* | (2006.01) |
| *G11C 8/06* | (2006.01) |
| *G11C 29/42* | (2006.01) |

(52) U.S. Cl.
CPC .......... *G06F 9/4403* (2013.01); *G11C 7/1069* (2013.01); *G11C 7/1096* (2013.01); *G11C 7/20* (2013.01); *G11C 8/06* (2013.01); *G11C 29/42* (2013.01)

(58) Field of Classification Search
None
See application file for complete search history.

(56) References Cited

U.S. PATENT DOCUMENTS

| | | |
|---|---|---|
| 5,838,165 A | 11/1998 | Chatter |
| 6,625,727 B1 | 9/2003 | Moyer et al. |
| 7,761,653 B2 | 7/2010 | Lee et al. |
| 8,219,719 B1 | 7/2012 | Parry et al. |
| 10,409,507 B1 | 9/2019 | Huang et al. |
| 10,552,270 B2 | 2/2020 | DeHaemer et al. |
| 10,860,305 B1 | 12/2020 | Harland et al. |
| 2002/0026550 A1* | 2/2002 | Suzuki ................. G06F 9/4411 710/9 |
| 2011/0099544 A1 | 4/2011 | Haramiishi et al. |
| 2020/0169459 A1* | 5/2020 | Colombo ........... H03K 19/1776 |

OTHER PUBLICATIONS

"Asynchronous serial communication," Wikipedia, URL=https://en.wikipedia.org/w/index.php?title=Asynchronous_serial_communication&old id=1060110288, download date Apr. 18, 2023. (3 pages).
"Linked list," Wikipedia, URL=https://en.wikipedia.org/w/index.php?title=Linked_list&oldid=1063112523, download date Apr. 18, 2023. (19 pages).

* cited by examiner

*Primary Examiner* — Charles J Choi
(74) *Attorney, Agent, or Firm* — Seed IP Law Group LLP

(57) ABSTRACT

A device includes an interface, which, in operation, couples to a non-volatile memory. The device includes circuitry coupled to the interface. The circuitry, in operation: reads a data configuration structure stored on the non-volatile memory, the data configuration structure being associated with a client circuit of a plurality of client circuits; and configures the client circuit, the configuring including writing data words of the data configuration structure to the client circuit, the writing including determining an address of the client circuit, the address being associated with at least one of the data words, the determining being based on number of data words in the data configuration structure.

17 Claims, 6 Drawing Sheets

DEVICE WITH CLIENT CONFIGURATION AND RELATED METHOD

BACKGROUND

Technical Field

The present disclosure is related to electronic devices, and more particularly, but not exclusively, to configuration of client circuitry by processing circuitry during a boot or reset sequence.

Description of the Related Art

In various devices and applications, data received from multiple sensors (e.g., accelerometer, gyroscope, magnetometer, radar, time-of-flight, photographic, location/navigation and/or videographic, and others) may be combined in order to provide more sophisticated functions. For example, mobile devices, automobiles and virtual reality systems may include image stabilization subsystems (e.g., Optical Image Stabilization and/or Electronic Image Stabilization) that utilize data from multiple sensors.

Processing circuitry, such as a micro-controller unit (MCU), receives, processes and integrates the data. Client circuitry, which may be referred to as client intellectual property (client IP), may perform processing on the data independent of, or in coordination with, the processing circuitry. Examples of client IP include analog-to-digital converters (ADCs), clock circuits (e.g., a ring oscillator), filters, and other analog, digital or mixed-signal (e.g., analog and digital) circuits, sensors and circuits receiving data from sensors, etc. Many client IPs include client circuitry that has performance characteristics that are configurable through trimming bits.

BRIEF SUMMARY

In an embodiment, a device includes client circuits, non-volatile memory, and processing circuitry. The non-volatile memory stores a data configuration structure associated with at least one of the client circuits. The processing circuitry configures a client circuit, which includes writing data words of the data configuration structure to the client circuit. An address associated with at least one of the data words is determined by the processing circuitry based on number of data words in the data configuration structure.

In an embodiment, a system comprises sensors and a device coupled to the sensors. The device includes client circuits, non-volatile memory, and processing circuitry. The non-volatile memory stores a data configuration structure associated with at least one of the client circuits. The processing circuitry configures a client circuit, which includes writing data words of the data configuration structure to the client circuit. An address associated with at least one of the data words is determined by the processing circuitry based on number of data words in the data configuration structure.

In one embodiment, a non-transitory computer-readable medium causes one or more processors to perform one or more automated operations. The automated operations include: reading a data configuration structure from non-volatile memory coupled to the one or more processors; and configuring a client circuit coupled to the one or more processors, the configuring including writing data words of the data configuration structure to the client circuit, the writing including determining an address associated with at least one of the data words based on number of data words in the data configuration structure.

In one embodiment, a method includes: storing a data configuration structure in non-volatile memory coupled to processing circuitry, the data configuration structure being associated with a plurality of client circuits coupled to the processing circuitry; and configuring a client circuit based on the data configuration structure, the configuring including writing data words of the data configuration structure to the client circuit, the writing including determining an address associated with at least one of the data words based on number of data words in the data configuration structure.

In one embodiment, a data structure stored on a computer readable medium includes an address record and a plurality of data records. Each of the plurality of data words stores configuration parameters. The address record includes: a chip select identifier; an address identifier; and an indicator of number of data words in the plurality of data words.

BRIEF DESCRIPTION OF THE SEVERAL VIEWS OF THE DRAWINGS

Reference will now be made by way of example only to the accompanying drawings. In the drawings, identical reference numbers identify similar elements or acts, and reference numbers identical but for a different suffix identify similar elements or acts, unless the context indicates otherwise. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first,"

"second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly indicates otherwise.

Figure 1:
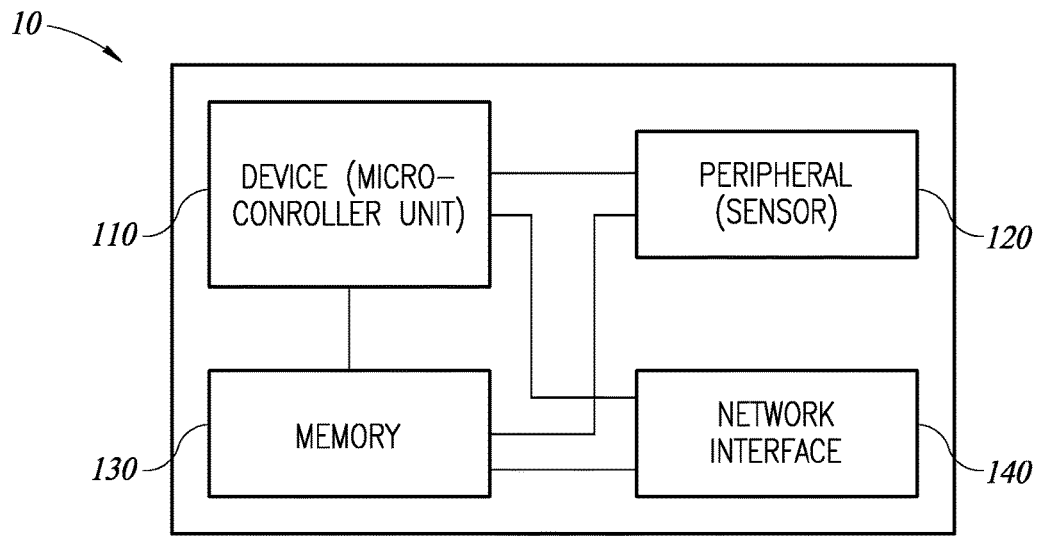
FIG. 1 is a schematic diagram of a system in accordance with various embodiments.

FIG. 1 illustrates a system 10 in accordance with various embodiments of the disclosure. The system 10 may perform sophisticated functions using one or more peripherals 120, which may include a sensor, a driver circuit, or the like. For example, an autonomous driving function of an automobile may be performed by integrating sensor data samples from multiple peripherals 120, including cameras, accelerometers, global positioning/navigation receivers, radar sensors and ultrasonic sensors. A motor control process, such as a brushless direct current (BLDC) motor control may be performed by the system 10, including providing a pulse width modulation (PWM) output to a DC motor. In some embodiments, the system 10 performs processing functions associated with automobile chassis and safety control, body control, traction inverter control, or the like.

The system 10 includes device 110, one or more peripherals 120, memory 130 and optional network interface 140. The system 10 may be an electronic system, or electronic control system, of an automobile, virtual reality hardware, augmented reality hardware, a power supply, an electric motor, a metering system, an audio system, a smart phone, or the like. As described above, the system 10 may provide one or more sophisticated functions that include integration, or fusion, by the device 110 of data samples generated by the peripherals 120, control of hardware by the peripherals 120, or both.

The device 110 may integrate data samples generated by the peripheral(s) 120 to provide sophisticated functions (e.g., autonomous driving, BLDC motor control, metering, or the like). In one embodiment, the device 110 is a microcontroller unit (MCU), a microprocessor unit (MPU), or the like. The device 110 or the system 10 may be a system-on-a-chip (SOC).

The device 110 is coupled to the memory 130, which may be system memory, and include memory circuitry. Coupling between the device 110 and the memory 130 may be by way of a memory interface, such as a double data rate (DDR) interface, a low-power DDR (LPDDR) interface, a system bus, or the like.

The device 110 is coupled to the peripheral 120. In one embodiment, the device 110 is coupled to multiple peripherals 120. A single peripheral 120 is illustrated in FIG. 1 for simplicity. Coupling between the device 110 and the peripheral 120 may be by a peripheral interface, such as a serial peripheral interface (SPI), an inter-integrated circuit (IIC, I2C) interface, or other suitable peripheral interface, or a system bus, such as an automotive bus system.

The device 110 may be coupled to the optional network interface 140, which may include an Ethernet interface, an automotive bus system interface, or the like. In one embodiment, one or more of the peripheral 120 and the network interface 140 is coupled to the memory 130. The device 110 may be in communicative connection with external electronic devices or components through the network interface 140.

In one embodiment, the peripherals 120 include a sensor, a driver circuit, other input circuit or output circuit, or a combination thereof. For example, input peripherals of the peripherals 120 may be or include a camera, an accelerometer, a navigation sensor, a time-of-flight sensor, a gyroscope, an inertial sensor, a humidity sensor, a compass, a microphone, a pressure sensor, a gas sensor, an encoder, or the like. In one embodiment, the system 10 includes a plurality of peripherals 120, such as a plurality of cameras, a plurality of accelerometers, a navigation sensor, a plurality of time-of-flight sensors, other sensors, combinations thereof, or the like. The peripherals 120 may include microelectro-mechanical systems (MEMS) sensors. Each of the peripherals 120 that are input peripherals generates data samples. For example, the data samples may include images, positional coordinates, depths or distances, temperatures, pressures, humidity, audio signals, angular position information, or the like.

The peripherals 120 may include output peripherals, such as driver circuits, which may include high-side driver circuits, low-side driver circuits, PWM driver circuits, traction control circuits, a combination thereof, or the like.

Figure 2:
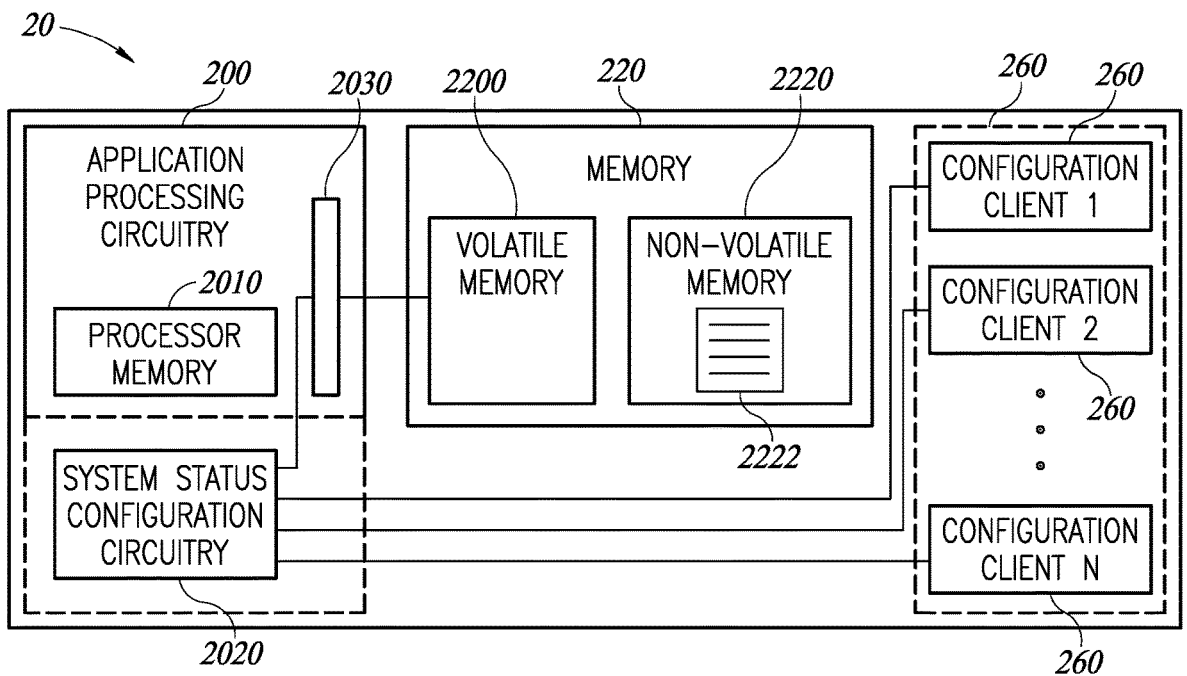
FIG. 2 is a schematic diagram of a device in accordance with various embodiments.

FIG. 2 illustrates a processor 20 in accordance with various embodiments. The processor 20 may be employed as the device 110 of FIG. 1. The processor 20 includes application processing circuitry 200, memory circuitry 220 and one or more client circuits 260. The processor 20 may be a general purpose processor, a microprocessor unit (MPU), a microcontroller unit (MPU), a central processing unit (CPU) or the like. The processor may be a system-on-a-chip (SOC). The processor 20 may integrate sensor data samples or other data of the peripheral(s) 120. The processor 20 may control operation (e.g., driving) of the peripherals 120.

The client circuits 260 may include analog circuits, digital circuits, or mixed-signal circuits. For example, the client circuits 260 may include analog-to-digital convertors (ADCs), clock generators (e.g., ring oscillators), filters, digital-to-analog convertors, current supplies, amplifiers, or other suitable circuits. Each of the client circuits 260 may be configurable. For example, each of the client circuits 260 may include a plurality of trimming or calibration bits, security bits, boot options, or other similar configuration bits. In FIG. 2, the client circuits 260 are shown as part of the processor 20. In some embodiments, one or more of the client circuits 260 is located external to the processor 20. For example, a client circuit 260 may be a part of the system 10 and outside the processor 20, such as one of the peripherals 120.

Embodiments of the disclosure configure the client circuits 260 of the device 110, such as the processor 20 during a reset or boot operation using data configuration structures stored in non-volatile memory (NVM) 2220 of the memory 220. During the system reset or boot sequence of the processor 20, operational parameters are configured before the processor 20 wakes up. In order to configure the processor 20, data configuration format (DCF) structures may be used. The DCF structures (or "data configuration structures 2222") include configuration information stored inside the NVM 2220, which is scanned during the reset or boot sequence of the processor 20. The part of the processor 20 receiving DCF data from the NVM 2220 is called a DCF client (e.g., the client circuits 260). Examples of DCF data are calibration bits for analog IPs, security level parameters of the processor 20, boot options (e.g., a memory location where the processor 20 boots from), and the like.

The application processing circuitry 200 may be an application processing unit (APU), central processing unit (CPU), host processor, or the like, and may be referred to as the "APU 200". The application processing circuitry 200 includes one or more processing cores. In one embodiment, the application processing circuitry 200 includes an arithmetic logic unit, which may include one or more of adder circuitry, shift register circuitry, carry/rotate logic circuitry, clock circuitry, control circuitry and the like. The application processing circuitry 200 includes processor memory 2010, such as a cache memory. The application processing circuitry 200 is coupled to the memory 220, for example, by an interface 2030.

The application processing circuitry 200 may include system status configuration circuitry 2020. The system status configuration circuitry 2020 (or simply, "the circuitry 2020") is in data communication with the memory 220 by the interface 2030, which may be a memory interface. The system status configuration circuitry 2020 is in data communication with the client circuits 260. In operation, the system status configuration circuitry 2020 reads the data configuration structure 2222 stored on the non-volatile memory 2220. The data configuration structure 2222 is associated with one or more of the client circuits 260. The system status configuration circuitry 2020 configures the client circuit 260. The configuring includes writing data words of the data configuration structure 2222 to the client circuit 260. The writing includes determining an address of the client circuit 260. The address is associated with at least one of the data words. The determining is based on number of data words in the data configuration structure 2222. Operation of the system status configuration circuitry 2020 is described in greater detail with reference to FIGS. 3-6. In one embodiment, the system status configuration circuitry 2020 is positioned in a location of the processor 20 outside the application processing circuitry 200, which allows configuration data to be loaded when the application processing circuitry 200 is still under reset. For example, the system status configuration circuitry 2020 may be a finite state machine where operations may be executed when the application processing circuitry 200 is under reset. In another example, the system status configuration circuitry 2020 may be circuitry located in the application processing circuitry 200 where instructions may be executed when the application processing circuitry 200 is booting, e.g., out of reset.

The memory 220 may be device memory circuitry. The memory 220 may be memory circuitry of an SOC, and may be referred to as SOC memory. The memory 220 is generally located in a region of the processor 20 outside the application processing circuitry 200. In some embodiments, the memory 220 is located outside the processor 20, such as in the system 10. The memory 220 is coupled to the application processing circuitry 200. The memory 220 may be shared by the application processing circuitry 200 and other circuitry of the processor 20. In some embodiments, the memory 220 is shared by the application processing circuitry 200 and other circuitry of the system 10. The memory 220 may include volatile memory 2200 and the non-volatile memory 2220. One or more data configuration structures 2222 are stored in the non-volatile memory 2220. In some embodiments, the non-volatile memory 2220 includes flash memory, phase-change module (PCM) memory, other suitable types non-volatile memory, combinations thereof, or the like.

The data configuration structures 2222 are stored inside NVM 2220, generally because data stored in the NVM 2220 is retained even when the processor 20 or system 10 is powered off. Memory capacity in MCUs (e.g., the processor 20) has become strained over time due to the increase of complexity of the MCU, for example, to manage functional safety and security options, and with the increase in technological needs in terms of trimming of analog functionalities (e.g., the client circuits 260). NVM storage becomes a potential bottleneck in case of low-end MCUs that embed only a small amount of NVM for code and data. For example, some MCUs that control BLDC motors include 1 kilobyte of NVM or less, and include as many as 50 data control structures 2222 or more.

Figure 3:
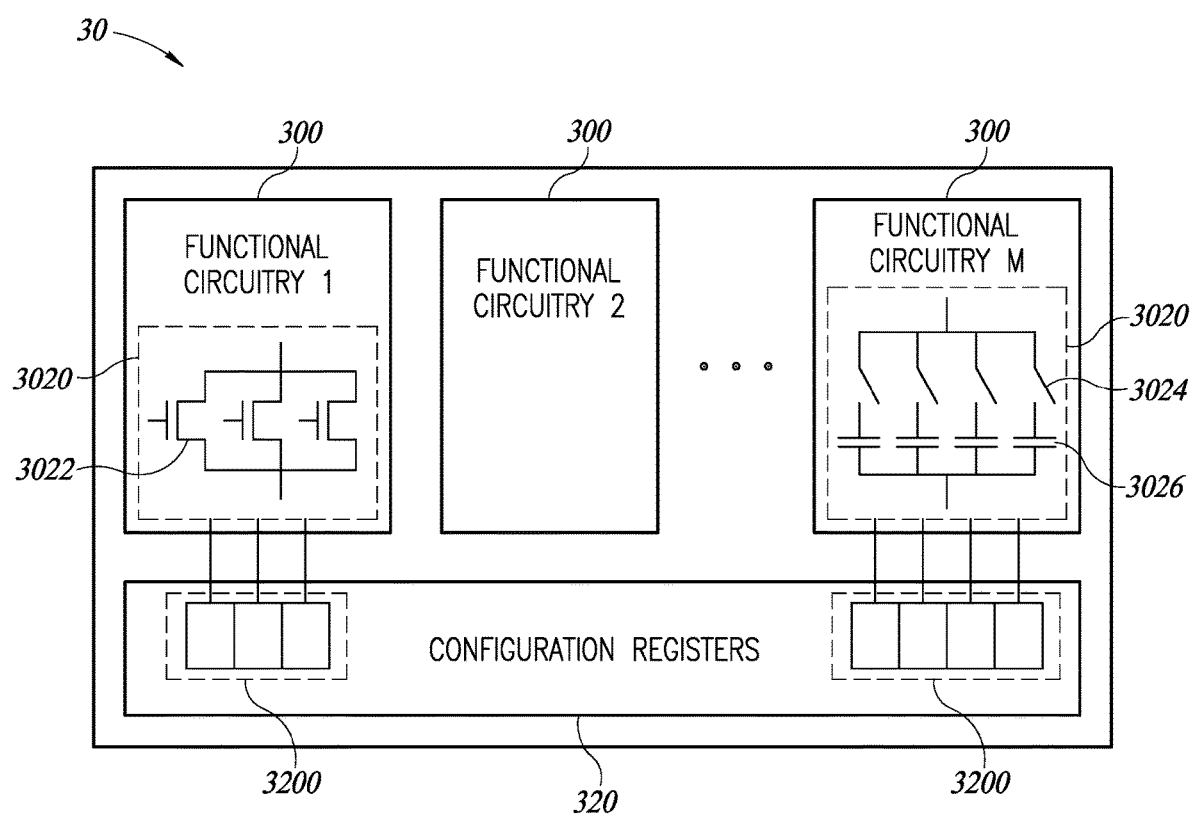
FIG. 3 is a schematic diagram of a client circuit in accordance with various embodiments.

FIG. 3 illustrates a client circuit 30, which may be employed as the client circuit 260 of FIG. 2. The client circuit 30 includes one or more functional circuits 300. For example, the client circuit 30 shown in FIG. 2 has first, second, through Mth functional circuits 300, labeled "Functional Circuitry 1", "Functional Circuit 2," . . . "Functional Circuitry M," respectively. One or more of the functional circuits 300 may be configurable. The client circuit 30 includes configuration registers 320, which includes configuration bits 3200 associated with the functional circuits 300 that are configurable. The configuration bits 3200 may be associated with an address. For example, the configuration bits 3200 associated with the first functional circuit 300 may be associated with a first address, and the configuration bits 3200 associated with the Mth functional circuit 300 may be associated with an Mth address different than the first address. In some embodiments, the configuration bits 3200 are associated with one or more memory words. For example, the configuration bits 3200 corresponding to the first functional circuit 300 may be associated with a first memory word of the configuration registers 320, and the configuration bits 3200 corresponding to the Mth functional circuit 300 may be associated with an Mth memory word of the configuration registers 320 that is different from the first memory word.

Each of the functional circuits 300 may represent a stage of the client circuit 30. For example, the client circuit 30 may be an ADC, and each of the functional circuits 300 may be an ADC stage. For example, a 12-bit ADC may include twelve of the functional circuits 300 (e.g., M=12).

The first functional circuit 300, labeled "Functional Circuitry 1," is configurable by three configuration bits 3200. A configurable portion 3020 of the first functional circuit 300 may include configurable components 3022, such as transistors. In the first functional circuit 300, the configurable components 3022 may collectively be a current source. The configuration bits 3200 associated with the first functional circuit 300 may control gate voltage of the configurable components 3022. By applying a high or a low voltage to gates of the configurable components 3022, the current source may output greater or lesser current. For example, by using three transistors having different widths, eight different currents may be output by the configurable portion 3020. Tuning output current of the configurable portion 3020 may be used to trim amplifier gain, for example.

In another example, the Mth functional circuit 300, labeled "Functional Circuitry M," may include a configurable portion 3020 that has a bank of switched capacitors. Each switched capacitor may include a switch 3024 and a capacitor 3026. The capacitors 3026 are connected in parallel. The switches 3024 may be closed or opened using the configuration bits 3200 associated with the Mth functional circuit 300. Closing one or more of the switches 3024 changes capacitance of the bank of switched capacitors. Tuning capacitance of the bank may be used to trim coefficients of a filter, for example.

In some embodiments, one or more of the functional circuits 300 (e.g., a second functional circuit 300 labeled "Functional Circuitry 2") may not include a configurable portion 3020. In some embodiments, a single functional circuit 300 may include more than one configurable portion 3020. A single memory word may store configuration bits 3200 used to trim multiple functional circuits 300.

Figure 4:
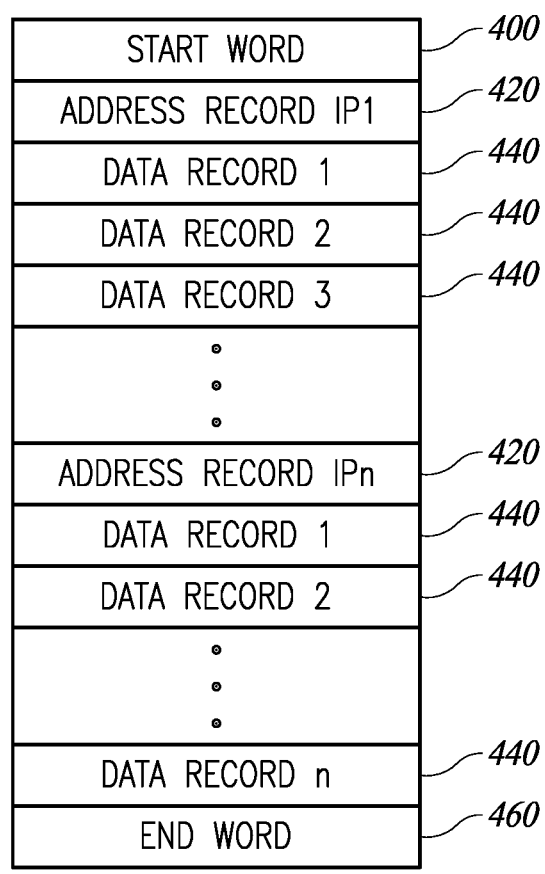
FIG. 4 is a diagram of a data configuration structure in accordance with various embodiments.

FIG. 4 illustrates a data configuration structure 40 (or DCF 40) in accordance with various embodiments. The data configuration structure 40 may be employed as the data configuration structure 2222 of FIG. 2. The data configuration structure 40 includes a start word 400 labeled "START WORD," one or more address records 420 labeled "ADDRESS RECORD IP1" . . . "ADDRESS RECORD IPn," and one or more data words 440 labeled "DATA RECORD 1," "DATA RECORD 2," "DATA RECORD 3," "DATA RECORD 1," "DATA RECORD 2," and "DATA RECORD n." The data configuration structure 40 includes an optional finish word 460. In some embodiments, the data configuration structure 40 is structured in a bus protocol format.

The data configuration structure 40 may be stored in the NVM 2220 as a plurality of words. In some embodiments, the start word 400 indicates to the processor 20 that the following data records 420, 440 should be processed. The optional finish word 460 indicates to the processor 20 that reading of the data configuration structure 40 from the NVM 2220 should stop.

The data words 440 configure functionalities inside each client circuit 260 (e.g., analog trimming, boot options, security options, or the like). For example, the data word 440 may include configuration bits 3200 (see FIG. 3) that are stored into the configuration registers 320 of the client circuit 30. Generally, all data words 440 of the data configuration structure 40 have the same size. For example, each of the data words 440 may be 32 bits. In some embodiments, each of the data words 440 includes 8 bits, 16 bits, 32 bits, 64 bits, or another suitable number of bits.

The address record 420 is common for all data words 440 associated with the same client circuit 260 (or client circuit 30). In some embodiments, an address record 420 may be associated with a set of client circuits having a consecutive address space, such as a set of a same type of client circuits 260 (e.g., a set of ADC client circuits having a consecutive address space). The address record 420 is described in greater detail with reference to FIG. 5. Briefly, embodiments of the disclosure reduce memory footprint for the data configuration structures 40 in the NVM 2220 by reducing the number of address records 420 included in the data configuration structure 40. To allow for the reduction in number of address records 420, the system status configuration circuitry 2020 (see FIG. 2) determines addresses of data words 440 following a first data word 440 (e.g., the data word 440 labeled "DATA RECORD 1") based on number of data words 440 indicated in the address record 420. By consolidating multiple data words 440 under a single, common address record 420, the inventors have reduced nonvolatile memory capacity consumed by the data configuration structures 40 by 36% or more.

In some embodiments, a data configuration structure 40 may be associated with a set of client devices of a same type. For example, a first address record IP1 420 of a data configuration structure 40 may be associated with a first ADC circuit, a second address record IP2 420 may be associated with a second ADC circuit, . . . and an Nth address record IPn 420 may be associated with an Nth ADC circuit.

Figure 5:
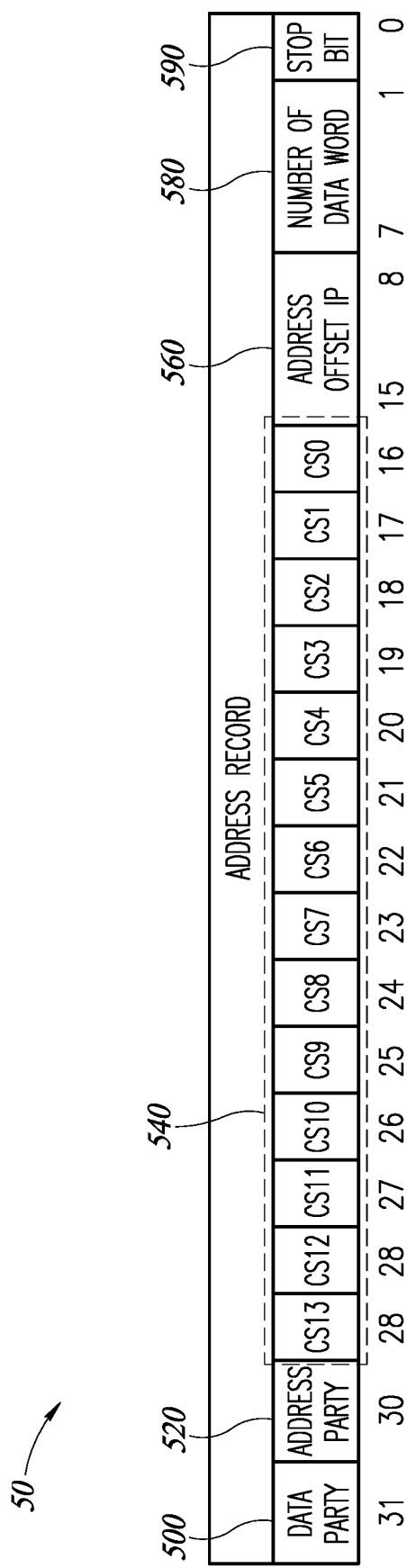
FIG. 5 is a diagram of an address record of a data configuration structure in accordance with various embodiments.

FIG. 5 illustrates an address record 50 in accordance with various embodiments. The address record 50 may be employed as the address record 420 of FIG. 4. The address record 50 includes a data parity bit 500 labeled "DATA PARITY," an address parity bit 520 labeled "ADDRESS PARITY," client select (or "chip select") bits 540 labeled "CS13," "CS12," . . . "CS0," address indicator bits 560 labeled "ADDRESS OFFSET IP," and number indicator bits 580 labeled "NUMBER OF DATA WORD."

The client select bits 540 may be associated with a client circuit 260 of the processor 20. For example, the client select bits 540 may have different values for the first client circuit 260 than for the Nth client circuit 260 (see FIG. 2), or different number values for a set of client circuits, such as a set of ADC client circuits. Each client circuit 260 or type of client circuits 260 of the processor 20 may be associated with a different configuration of the client select bits 540. As such, when the address record 50 is read from the NVM 2220 by the system status configuration circuitry 2020, the system status configuration circuitry 2020 may apply data words 440 following the address record 50 to the client circuit 260 or a set of client circuits 260 indicated by the client select bits 540. A number of bits of the client select bits 540 may be varied depending on number of client circuits 260 or types of client circuits to be selected in the processor 20. For example, in the configuration illustrated in FIG. 5, the client select bits 540 include 14 bits. In some embodiments, more or fewer than fourteen bits may be included in the client select bits 540, such as 12 bits, 16 bits, or another suitable number of bits.

The address indicator bits 560 store an address of the client circuit 260 or an address of a first client circuit of a set of client circuits 260. For example, the address indicator bits 560 may be associated with a location of the configuration bits 3200 of the configuration registers 320 (see FIG. 3). In some embodiments, the address indicator bits 560 include eight bits, as shown in FIG. 5, or more or fewer than eight bits, such as seven bits, nine bits, or another suitable number of bits. The number of bits of the address indicator bits 560 may be varied depending on number of words in the configuration registers 320.

The number indicator bits 580 indicate a number of data words 440 associated with (e.g., following) the address record 50. Including the number indicator bits 580 allows the system status configuration circuitry 2020 to determine (e.g., infer) where to store each data word 440 in the configuration registers 320 without the need for an address record 420 before each data word 440. For example, the first data word 440 may be stored at the address indicated by the address indicator bits 560. Then, the second data word 440 may be stored at an address determined by the system status configuration circuitry 2020 based on the number indicator bits 580. In the device 110 (e.g., a microcontroller unit), the system status configuration circuitry 2020 or the processor 20 may increment the address by a quantity, which depends on the size of the data words and on the addressing mode, in order to address the next data record 440. For example, considering 32-bit data words addressed by byte, the address may be incremented by a factor of 4 (e.g., four bytes) for each data word 440. In this case, the address of the last or final data word 440 is equal to ADDRESS_OFFSET+ n_word*4, where ADDRESS_OFFSET is the address stored in the address indicator bits 560, and n_word is the number stored in the number indicator bits 580. Once the last data word 440 is stored in the configuration registers 320, the system status configuration circuitry 2020 determines that the next word of the data configuration structure 40 is an address record 420, as illustrated in FIG. 4.

As one non-limiting example, a client circuit 260 may be associated with 128 bits of trimming or calibration bits. For 32-bit data words 440, number of data words is 4. By using a common address record 420 for the data configuration structure 40 associated with the client circuit 260, 96 bits (or 37.5%) may be saved compared to approaches that use one address record 420 per data word 440.

The data parity bit 500 is a bit that indicates parity of the data words 440 associated with the address record 50. The system status configuration circuitry 2020 may read the data parity bit 500 and determine whether a data word 440 is corrupted based thereon.

The address parity bit 520 is a bit that indicates parity of the address indicator bits 560, and may be used to determine whether the address indicator bits 560 are corrupted.

In some embodiments, the address record 50 includes a stop bit 590. The stop bit 590 may be included in each address record 420 shown in FIG. 4. By including the stop bit 590, the optional finish word 460 may not be included in the data configuration structure 40. By replacing a dedicated stop address record (e.g., the optional finish word) with a stop bit 590 in each address record 420, reductions in memory footprint may be achieved.

Figure 6:
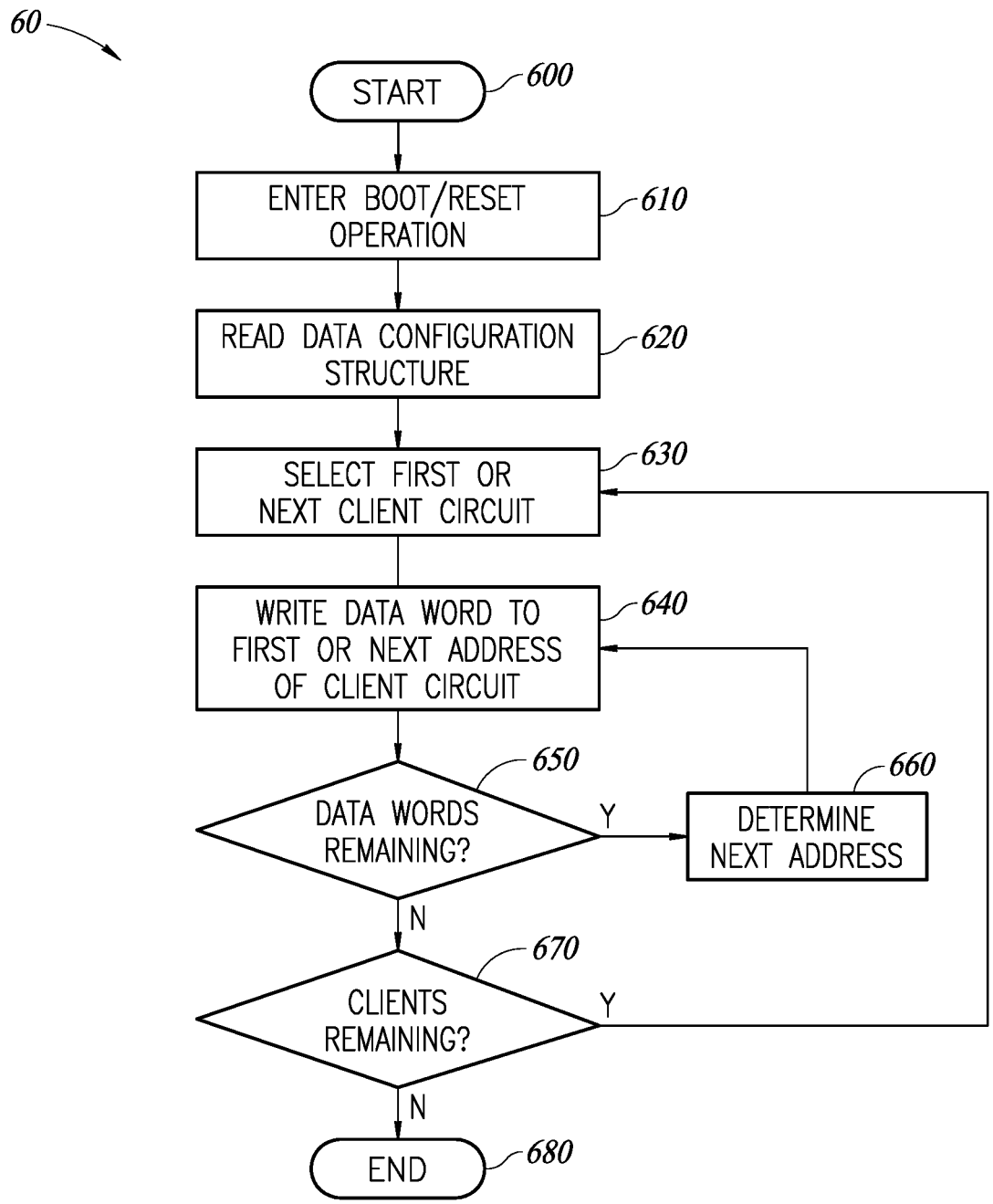
FIG. 6 is a diagram of a method in accordance with various embodiments.

FIG. 6 illustrates a flowchart of a method 60 in accordance with various embodiments. The following description of FIG. 6 makes reference to components of the processor 20 for purposes of illustration, but the method 60 may be performed by processors having a different configuration than the processor 20.

The method 60 begins with act 600. In act 610, a boot operation or reset operation is entered, for example, by the processor 20. The boot operation may be entered when the system 10 including the processor 20 is powered on from a powered off state. In some embodiments, one or more components of the system 10 is powered on, and the boot operation is entered when the processor 20 is powered on from a powered off state. The reset operation may be entered when the processor 20 is reset from a powered on state. During the boot or reset operation, operational parameters are configured as or before the processor 20 wakes up. For example, configuration bits or trimming bits of the client circuits 260 are stored by the system status configuration circuitry 2020, as described with respect to acts 620 to 670.

In act 620, a data configuration structure is read. The data configuration structure may be the same as, or similar to, the data configuration structures 2222, 40 illustrated in FIGS. 2 and 4, respectively. The data configuration structure may be read from non-volatile memory, such as the non-volatile memory 2220 of the memory 220 of FIG. 2.

In act 630, a first or next client circuit is selected. For example, the first client circuit 260 may be selected. The first client circuit 260 may be selected based on the client select bits of the first address record 420 of the data configuration structure 40, as described with respect to FIG. 5.

In act 640, a data word is written to a first or next address of the client circuit selected in act 630. For example, the first data word 440 may be written to a first address of the first client circuit 260. The first data word 440 may be read from the non-volatile memory 2220 by the system status configuration circuitry 2020, and may be written to the first client circuit 260 by the system status configuration circuitry 2020. The first data word 440 may be written to the configuration registers 320 of the first client circuit 260.

In act 650, if data words are remaining, the method 60 proceeds to act 660. If no data words are remaining, the method 60 proceeds to act 670. In act 650, the system status configuration circuitry 2020 may determine whether data words are remaining based on the number indicator bits 580. For example, the system status configuration circuitry 2020 may compare a number of data words 440 written with the number indicated by the number indicator bits 580. If the number of data words 440 written is fewer than the number indicated by the number indicator bits 580, the method 60 may proceed to act 660. If the number of data words 440 written is equal to the number indicated by the number indicator bits 580, the method 60 may proceed to act 670.

Prior to proceeding to act 640 when data words remain, the next address of the client circuit is determined in act 660. For example, the system status configuration circuitry 2020 may determine the next address by incrementing the address by the size of the data words 440, such as 32 bits (e.g., a factor of 4 in the case of 32-bit data words addressed by byte), as described with reference to FIG. 5. The method 60 may then proceed to act 640, in which a data word 440 is written to the next address.

Once no data words are remaining, the method 60 may proceed to act 670. In act 670, if client circuits are remaining to be configured, the method 60 proceeds to act 630 to select the next client circuit. If no client circuits are remaining to be configured, the method 60 may proceed to end at act 680. The system status configuration circuitry 2020 may determine whether client circuits are remaining or not remaining based on reading a finish word (e.g., the finish word 460) of the data configuration structure, which may have similar structure to the address record 420. In some embodiments, the system status configuration circuitry 2020 determines whether the client circuits are remaining based on reading a stop bit 590 of the address records 420. When the stop bit 590 indicates that the address record 420 is the last address record 420 of the data configuration structure 40, the system status configuration circuitry 2020 may stop reading the data configuration structure 40 from the NVM 2220 after reading the last data word 440 associated with the last address record 420. This may be used instead of a dedicated finish word (e.g., the finish word 460), saving space.

If client circuits remain in act 670, the system status configuration circuitry 2020 may read the next address record 420, and select the next client circuit 260 associated with the address indicator bits 560 of the next address record 420. The method 60 may then proceed to act 650, as described above.

Once all clients have been configured in acts 630 to 670, the method 60 may end at act 680.

In some embodiments, the method 60 includes a number of operations. It should be noted that the operations of the method 60 may be rearranged or otherwise modified (e.g., removed) within the scope of the various embodiments. It should be noted that additional processes may be provided before, during, and after the method 60, and that some other processes may be only briefly described herein. For example, an error handling operation may be performed after act 630 when the address parity bit 520 does not match parity of the address indicator bits 560. In another example, another error handling operation may be performed after act 640 when the data parity bit 500 does not match parity of the data words 440 associated with the address record 420. In another example, the method 60 may be modified to include an act after 670 to determine whether another data configuration structure associated with another set of client devices should be read and processed (e.g., by returning to act 620). This is applicable when multiple data configuration structures 2222 are present inside the NVM memory 220 at different start addresses.

Figure 7:
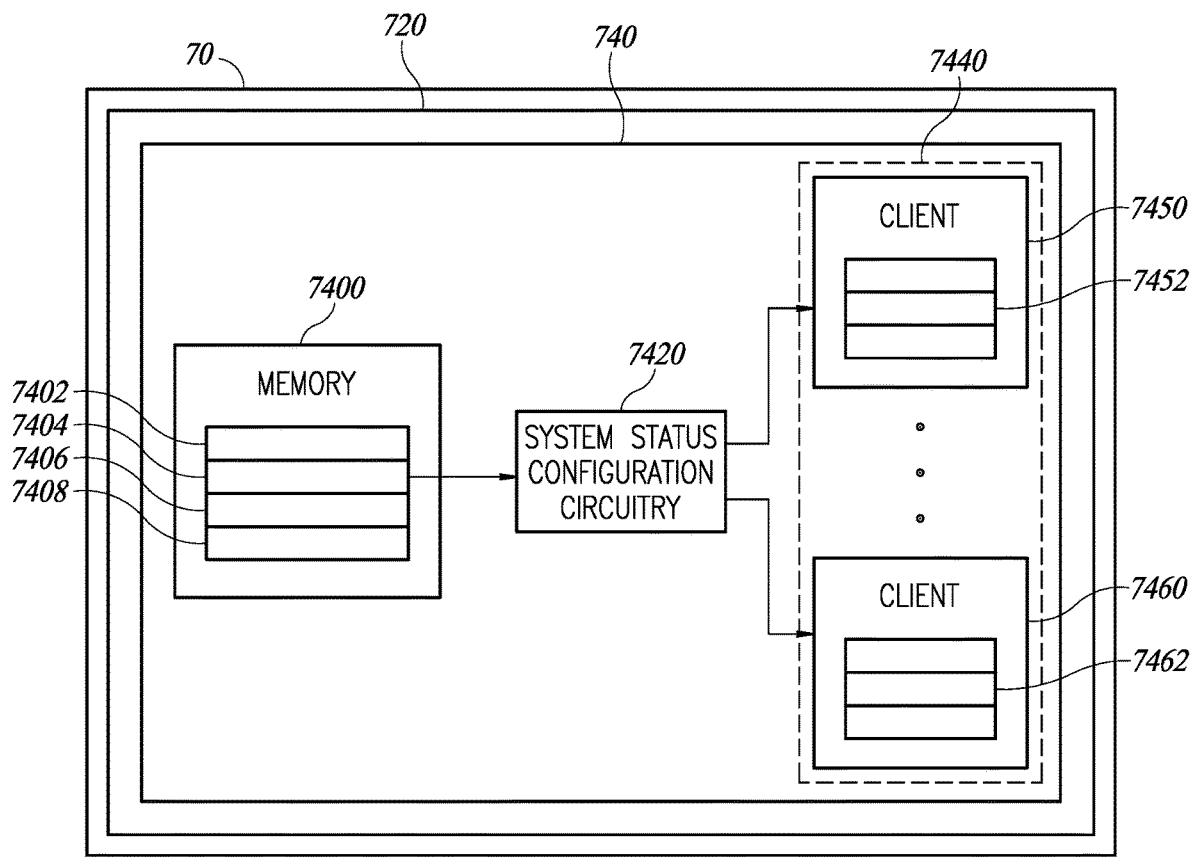
FIG. 7 is a diagram of a vehicle system in accordance with various embodiments.

FIG. 7 is a diagram of a system 70 in accordance with various embodiments. The system 70 may be a vehicle, virtual reality headset, smart metering system, smart phone, or other system. The system 70 includes a subsystem controller unit or circuitry or structure 720, such as an engine controller unit in the example of a vehicle. The subsystem controller unit 720 may be similar or the same as the system 10 of FIG. 1, and includes a microcontroller unit or processor 740. The microcontroller unit 740 may be similar to or the same as the processor 20 of FIG. 2. The microcontroller unit 740 includes memory 7400, which may be similar to or the same as the memory 220 or the NVM 2220 of FIG. 2. The memory 7400 includes a code memory array 7402, a data memory array 7404, a user parameter array 7406, and a reserved area 7406. The user parameter array 7406 stores a data configuration structure, which may be similar to or the same as the data configuration structure 2222 of FIG. 2 or the data configuration structure 40 of FIG. 4. The microcontroller unit 740 includes system status configuration circuitry 7420, which may be similar to or the same as the system status configuration circuitry 2020 of FIG. 2. The microcontroller unit 740 includes client circuits 7440, such as a first client circuit 7450 and a second client circuit 7460, which may be similar to or the same as the client circuits 260 of FIG. 2 or the client circuit 30 of FIG. 3. The first client circuit 7450 may include configuration bits 7452, which may be the same as or similar to the configuration bits 3200 of FIG. 3. The second client circuit 7460 may include configuration bits 7462, which may be the same as or similar to the configuration bits 3200 of FIG. 3.

Embodiments may provide advantages. Memory footprint for the data configuration structures in the NVM is reduced by processing circuits that determine addresses of data words following a first data word based on number of data words indicated in an address record of the data configuration structure. By consolidating multiple data words under a single, common address record, non-volatile memory capacity consumed by the data configuration structures may be reduced by 36% or more. By replacing a dedicated stop address record with a stop bit in each address record, reductions in memory footprint may be achieved.

In an embodiment, a device includes an interface, which, in operation, couples to a non-volatile memory. The device includes circuitry coupled to the interface. The circuitry, in operation: reads a data configuration structure stored on the non-volatile memory, the data configuration structure being associated with a client circuit of a plurality of client circuits; and configures the client circuit, the configuring including writing data words of the data configuration structure to the client circuit, the writing including determining an address of the client circuit, the address being associated with at least one of the data words, the determining being based on number of data words in the data configuration structure.

In an embodiment, a system includes peripheral circuitry and a device coupled to the peripheral circuitry. The device includes an interface, which, in operation, couples to a non-volatile memory. The device includes circuitry coupled to the interface. The circuitry, in operation: reads a data configuration structure stored on the non-volatile memory, the data configuration structure being associated with a client circuit of a plurality of client circuits; and configures the client circuit, the configuring including writing data words of the data configuration structure to the client circuit, the writing including determining an address of the client circuit, the address being associated with at least one of the data words, the determining being based on number of data words in the data configuration structure.

In one embodiment, a method includes: reading a data configuration structure stored on non-volatile memory, the data configuration structure being associated with a client circuit; and configuring the client circuit, the configuring including writing data words of the data configuration structure to the client circuit, the writing including determining an address of the client circuit, the address being associated with at least one of the data words, the determining being based on number of data words in the data configuration structure.

In one embodiment, a non-transitory computer-readable medium storing contents that cause a device to perform operations. The operations include: reading a data configuration structure stored on non-volatile memory, the data configuration structure being associated with a client circuit; and configuring the client circuit, the configuring including writing data words of the data configuration structure to the client circuit, the writing including determining an address of the client circuit, the address being associated with at least one of the data words, the determining being based on number of data words in the data configuration structure.

In one embodiment, a computer-readable medium is encoded with a data structure. The data structure comprises: a plurality of data words, each storing configuration parameters; and an address record. The address record includes: a chip select identifier; an address identifier; and an indicator of number of data words in the plurality of data words.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   an interface, which, in operation, couples to a non-volatile memory; and
   circuitry coupled to the interface, wherein the circuitry, in operation:
   reads a data configuration structure stored on the non-volatile memory, the data configuration structure being associated with a plurality of client circuits and including a plurality of data words and a plurality of address records; and
   configures a client circuit of the plurality of client circuits, the configuring including:
   writing data words of the data configuration structure to the client circuit, the writing including determining an address of the client circuit, the address being associated with at least one of the data words, the determining being based on a number of data words in the data configuration structure; and
   configuring a security parameter of the client circuit using security bits of the data words, the configuring a securing parameter of the client circuit including storing security bits of a data word of the data configuration structure into a configuration register of the client circuit, wherein,
the determining an address of the client circuit includes:
obtaining the number of data words from an address record of the data configuration structure, the address record being associated with the client circuit; and
adding a data word length to an address identifier of the address record; and
the circuitry stops configuring the client circuit in response to a stop bit of the address record associated with the client circuit.

2. The device of claim 1, wherein the circuitry checks parity of the data words by a data parity bit of the address record associated with the client circuit.

3. The device of claim 1, wherein the circuitry checks parity of the address record by an address parity bit of the address record associated with the client circuit.

4. The device of claim 1, wherein the circuitry configures the client circuit during a boot operation of the device or during a reset operation of the device.

5. The device of claim 1, wherein the circuitry configures at least one parameter of an analog circuit, mixed-signal circuit, digital circuit or combination thereof using trimming bits of the data words.

6. The device of claim 1, wherein the circuitry, in operation:
writes a first data word to a first address of the client circuit associated with a first address record;
writes a second data word to a second address determined from the first address; and
writes a third data word to a third address of the client circuit associated with a second address record different from the first address record.

7. The device of claim 1, wherein the device comprises the non-volatile memory.

8. The device of claim 1, wherein the device comprises the client circuit.

9. The device of claim 1, wherein the plurality of client circuits includes at least one peripheral circuit, and configuring the client circuit includes configuring the peripheral circuit.

10. A system, comprising:
a peripheral circuit; and
a device coupled to the peripheral circuit, the device including:
an interface, which, in operation, couples to a non-volatile memory; and
circuitry coupled to the interface, wherein the circuitry, in operation:
reads a data configuration structure stored on the non-volatile memory, the data configuration structure being associated with a plurality of client circuits and including a plurality of data words and a plurality of address records, the plurality of client circuits including the peripheral circuit; and
configures the peripheral circuit, the configuring including:
writing data words of the data configuration structure to the peripheral circuit, the writing including determining an address of the peripheral circuit, the address being associated with at least one of the data words, the determining being based on a number of data words in the data configuration structure; and
configuring a security parameter of the peripheral circuit using security bits of the data words, the configuring a securing parameter of the peripheral circuit including storing security bits of a data word of the data configuration structure into a configuration register of the peripheral circuit, wherein
the determining an address includes:
obtaining the number of data words from an address record of the data configuration structure, the address record being associated with the peripheral circuit; and
adding a data word length to an address identifier of the address record; and
the circuitry stops configuring the peripheral circuit in response to a stop bit of the address record associated with the peripheral circuit.

11. The system of claim 10, wherein the circuitry, in operation:
configures the peripheral circuit in response to a reset operation or a boot operation.

12. The system of claim 11, wherein the device, in operation, controls the peripheral circuit in normal operation, the normal operation being different from the reset operation and the boot operation.

13. The system of claim 10, wherein the adding a data word length includes:
multiplying the data word length by the number of data words.

14. A method, comprising:
reading a data configuration structure stored on non-volatile memory, the data configuration structure being associated with a client circuit and including a plurality of data words and a plurality of address records; and
configuring the client circuit, the configuring including:
writing data words of the data configuration structure to the client circuit, the writing including determining an address of the client circuit, the address being associated with at least one of the data words, the determining being based on a number of data words in the data configuration structure; and
configuring a security parameter of the client circuit using security bits of the data words, the configuring a securing parameter of the client circuit including storing security bits of a data word of the data configuration structure into a configuration register of the client circuit, wherein,
the determining an address includes:
obtaining the number of data words from an address record of the data configuration structure, the address record being associated with the client circuit; and
adding a data word length to an address identifier of the address record; and
the configuring the client circuit is stopped in response to a stop bit of the address record.

15. A non-transitory computer-readable medium storing contents that cause a device to perform operations, the operations comprising:
reading a data configuration structure stored on non-volatile memory, the data configuration structure being associated with a client circuit and including a plurality of data words and a plurality of address records; and
configuring the client circuit, the configuring including:
writing data words of the data configuration structure to the client circuit, the writing including determining an address of the client circuit, the address being associated with at least one of the data words, the determining being based on a number of data words in the data configuration structure; and configuring a security parameter of the client circuit using security bits of the data words, the configuring a securing parameter of the client circuit including storing security bits of a data word of the data configuration structure into a configuration register of the client circuit, wherein, the determining an address includes:
obtaining the number of data words from an address record of the data configuration structure, the address record being associated with the client circuit; and
adding a data word length to an address identifier of the address record; and the configuring the client circuit is stopped in response to a stop bit of the address record.

16. The non-transitory computer-readable medium of claim 15, wherein the contents are instructions executed by one or more processors of the device.

17. A non-transitory computer-readable medium encoded with a data structure, the data structure comprising:
a plurality of data words, each storing configuration parameters of a client circuit; and
a plurality of address records, each including:
a chip select identifier associated with a client circuit;
an address identifier;
an indicator of a number of data words in the plurality of data words, wherein at least one of the data words includes security bits to store in a configuration register of the client circuit to configure a security parameter of the client circuit; and
a stop bit, wherein, in operation, the data structure is used to configure the client circuit associated with the chip select identifier, the configuring including:
writing one of the plurality of data words to the client circuit, the writing including:
determining an address of the client circuit based on the address identifier and the indicator; and
writing the one of the plurality of data words to the address; and
configuring the security parameter of the client circuit using the security bits of the data words, the configuring the securing parameter of the client circuit including storing security bits of a data word of the data configuration structure into the configuration register of the client circuit, wherein, the determining an address includes:
obtaining the number of data words from the address record of the data configuration structure, the address record being associated with the client circuit; and
adding a data word length to an address identifier of the address record; and
the configuring the client circuit is stopped in response to a stop bit of the address record.

* * * * *